United States Patent
Moeckly et al.

(10) Patent No.: US 8,290,553 B2
(45) Date of Patent: Oct. 16, 2012

(54) DEVICE AND METHOD FOR FABRICATING THIN FILMS BY REACTIVE EVAPORATION

(75) Inventors: Brian H. Moeckly, Menlo Park, CA (US); Ward S. Ruby, Palm City, FL (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 0 days.

(21) Appl. No.: 13/219,380

(22) Filed: Aug. 26, 2011

(65) Prior Publication Data

US 2011/0303153 A1    Dec. 15, 2011

Related U.S. Application Data

(60) Division of application No. 12/209,142, filed on Sep. 11, 2008, now Pat. No. 8,022,012, which is a continuation of application No. 10/726,232, filed on Dec. 1, 2003, now Pat. No. 7,439,208.

(51) Int. Cl.
- *C23C 16/448* (2006.01)
- *C23C 16/458* (2006.01)
- *H01L 39/24* (2006.01)
- *H01L 21/00* (2006.01)
- *H01L 41/00* (2006.01)

(52) U.S. Cl. ........ 505/150; 505/826; 505/950; 118/726; 118/729; 118/719; 118/723 VE

(58) Field of Classification Search .................. 505/150, 505/191, 230, 330, 470, 473–475, 701, 826, 505/950; 118/715, 718–720, 723 VE, 723 EB, 118/723 HC, 724–731; 427/62, 248.1, 251, 427/255.5; 438/478, 584, 758; 428/210, 428/426, 472, 688, 698, 701

See application file for complete search history.

(56) References Cited

U.S. PATENT DOCUMENTS 4,420,385 A    12/1983 Hartsough
(Continued)

FOREIGN PATENT DOCUMENTS

EP    1640471 A2    3/2006

OTHER PUBLICATIONS

Birinkman, A. et al., "Superconducting Thin Films of $MgB_2$ on Si by Pulsed Laser Deposition", Physica C 353 (2001), pp. 1-4.

(Continued)

*Primary Examiner* — Stanley Silverman
*Assistant Examiner* — Kallambella Vijayakumar
(74) *Attorney, Agent, or Firm* — Vista IP Law Group LLP

(57) ABSTRACT

A device for fabricating thin films on a substrate includes a vacuum chamber, a rotatable platen configured to hold one or more substrates within the vacuum chamber, and a housing disposed within the vacuum chamber. The housing contains a heating element and is configured to enclose an upper surface of the platen and a lower portion configured to partially enclose an underside surface of the platen which forms a reaction zone. A heated evaporation cell is operatively coupled to the lower portion of the housing and configured to deliver a pressurized metallic reactant to the reaction zone. The device includes a deposition zone disposed in the vacuum chamber and isolated from the reaction zone and is configured to deposit a deposition species to the exposed underside of the substrates when the substrates are not contained in the reaction zone.

23 Claims, 17 Drawing Sheets

U.S. PATENT DOCUMENTS

| | | | |
|---|---|---|---|
| 4,851,095 | A | 7/1989 | Scobey et al. |
| 5,389,606 | A | 2/1995 | Face |
| 5,423,914 | A | 6/1995 | Nakamura et al. |
| 6,294,025 | B1 | 9/2001 | Kinder |
| 6,514,557 | B2 | 2/2003 | Finnemore et al. |
| 6,527,866 | B1 * | 3/2003 | Matijasevic et al. ......... 118/719 |
| 6,626,995 | B2 | 9/2003 | Kim et al. |
| 6,797,341 | B2 | 9/2004 | Zeng et al. |
| 6,835,696 | B2 | 12/2004 | Saito et al. |
| 6,929,820 | B2 | 8/2005 | Shimakage et al. |
| 7,439,208 | B2 | 10/2008 | Moeckly et al. |
| 2001/0036214 | A1 | 11/2001 | Bozovic et al. |
| 2002/0096711 | A1 | 7/2002 | Kim et al. |
| 2002/0111275 | A1 | 8/2002 | Finnemore et al. |
| 2002/0127437 | A1 | 9/2002 | Cheong et al. |
| 2002/0132739 | A1 | 9/2002 | Kang et al. |
| 2002/0173428 | A1 | 11/2002 | Thieme et al. |
| 2003/0073324 | A1 | 4/2003 | Matijasevic et al. |
| 2003/0096710 | A1 | 5/2003 | Dunand |
| 2003/0096711 | A1 | 5/2003 | Saito et al. |
| 2003/0099871 | A1 | 5/2003 | Finnemore et al. |
| 2003/0130130 | A1 | 7/2003 | Shimakage et al. |
| 2003/0146417 | A1 | 8/2003 | Romonovich et al. |
| 2005/0116204 | A1 | 6/2005 | Moeckly et al. |

OTHER PUBLICATIONS

Bu, S.D. et al., "Synthesis and Properties of c-axis Oriented Epitaxial MgB2 Thin Films", Appl. Phys. Lett., vol. 81, No. 10, pp. 1851-53, 2002.

Eom, C. B. et al., "High Critical Current Density and Enhanced Irreversibility Field in Superconducting MgB2 Thin Films", Nature, vol. 411, May 31, 2001, pp. 558-560.

Knauf, Jurgen et al., "YbaCuO—Deposition on Metal Tape Substrates", presented at ASC2000, Virginia Beach, USA, Sep. 17-22, 2000, pp. 1-4.

Liu, Z. et al., "Thermodynamics of the Mg-B System: Implications for the Deposition of MgB2 Thin Films", Applied Physics Letters, vol. 78, No. 23, 4 Jun. 2001, pp. 3678-3680.

Nagomatsu, J. et al., "Superconductivity at 39K in Magnesium Diboride", Nature, vol. 410, Mar. 1, 2001, pp. 63-64.

Nemetschek, H. et al., "Continuous Coated Conductor Fabrication by Evaporation", presented at EUCAS 2003, 14.-19.0.2003, Sorrento, Italy, pp. 1-5.

Nemetschek, R. et al.,"Continuous Tape Coating by Thermal Evaporation", presented at the ASC 2002 in Houston, TX, Aug. 5-9, 2002, pp. 1-5.

Nemetschek, R. et al., "Continuous YBa2Cu3O7—Tape Deposition by Thermal Evaporation", presented at EUCAS 2001, Copenhagen, Denmark, Aug. 26-30, 2001.

Prusseit, W. et al., "Continuous Coated Conductor Fabrication by Evaporation", presented at MRS 2003 in Boston, USA, Dec. 1-5, 2003, pp. 1-3.

Prusseit, W. et al., "The ISD—Evaporation Route to Coated Conductors", presented at CCA 2003 at Lago d-Orta, Italy, Sep. 12-13, 2003, pp. 10-12.

Ueda, K. et al., "Growth of Superconducting MgB2 Thin Films", Studies of High Temperature Superconductors (Nova Science Publishers, Inc.), 44 (2003) pp. 237-270.

Ueda, K. et al., "As-Grown Superconducting MgB2 Thin Films Prepared by Molecular Beam Epitaxy", Applied Physics Letters, vol. 79, No. 13, Sep. 24, 2001, pp. 2046-2048.

Zeng, X. et al., "In Situ Epitaxial MgB2 Thin Films for Superconducting Electronics", Nature Materials, vol. 1 Sep. 2002, pp. 1-4.

Schneider, R. et al. "In situ synthesis of MgB2 thin films for tunnel junctions", Applied Physics Letters, vol. 85, No. 22, pp. 5290-5292, American Institute of Physics, Melville, New York, Nov. 29, 2004 (3pages).

* cited by examiner

DEVICE AND METHOD FOR FABRICATING THIN FILMS BY REACTIVE EVAPORATION

RELATED APPLICATION

This Application is a divisional of U.S. application Ser. No. 12/209,142, now issued as U.S. Pat. No. 8,022,012, which is a continuation of U.S. application Ser. No. 10/726,232 filed on Dec. 1, 2003, now issued as U.S. Pat. No. 7,439,208. The above-noted Applications and Patents are incorporated by reference as if set forth fully herein.

STATEMENT REGARDING FEDERALLY SPONSORED RESEARCH AND DEVELOPMENT

The U.S. Government may have a paid-up license in this invention and a right in limited circumstances to require the patent owner to license others on reasonable terms as provided for by the terms of Contract No. N00014-03-M-0005 awarded by the Office of Naval Research.

FIELD OF THE INVENTION

The field of the invention generally relates methods used to produce thin films. More specifically, the field of the invention relates to methods of forming films in-situ such as superconducting $MgB_2$ that do not require high temperature annealing.

BACKGROUND OF THE INVENTION

Magnesium diboride ($MgB_2$) is a superconducting material having a superconducting transition temperature ($T_c$) of approximately 39 K. There is a significant interest in using $MgB_2$ to form superconducting wires, tapes, and films. Superconducting wire, for example, can be used for superconducting magnets, fault-current limiters, and power transmission. Films can be used to make Josephson junctions, SQUIDS (superconducting quantum interference devices), microelectronic interconnects, RSFQ (rapid single flux quantum) devices, and other devices. Films can also be incorporated into RF and microwave devices in the form of resonators, filters, delay lines, and the like.

With respect to film applications, growth of completely in-situ $MgB_2$ films is required in order to realize the multilayer technology necessary for electronics applications. The primary difficulty of depositing $MgB_2$ films is the very high vapor pressures of Mg required for the thermodynamic stability of the $MgB_2$ phase at elevated temperatures. A second problem relating to $MgB_2$ film formation is the high sensitivity of Mg to oxidation. Both of these concerns have made it difficult to grow $MgB_2$ films using conventional physical vapor deposition (PVD) techniques.

In-situ $MgB_2$ films have been fabricated by annealing Mg—B or Mg—$MgB_2$ mixtures in situ in growth chambers. However, films produced by such techniques have shown a lower $T_c$ and poor crystallinity. In-situ $MgB_2$ films have also been fabricated at low temperatures (<350° C.) but these films are not epitaxial, their crystallinity is poor, their $T_c$ values are low, and their resistivities are high. Zeng et al. have grown $MgB_2$ films in-situ by using HPCVD (hybrid physical-chemical vapor deposition) techniques. See X. H. Zeng et al., *In situ epitaxial $MgB_2$ thin films for superconducting electronics*, Nature Materials 1, pp. 1-4 (2002). However, this method is not readily amenable to multilayer devices or applications requiring large-area film growth. Furthermore, the substrate temperature used in the method proposed by Zeng et al. is above 700° C., and growth has been successful only on a limited number of substrate materials.

There thus is a need for a method of producing $MgB_2$ films in-situ within a temperature range of approximately 300° C. to approximately 700° C. A method is also needed that can grow $MgB_2$ films in-situ on a variety of substrate materials. A method is needed that can produce in-situ $MgB_2$ suitable for use in multilayer device fabrication. The method is also preferably applicable to superconducting films other than $MgB_2$.

SUMMARY OF THE INVENTION

In a first embodiment of the invention, a device for fabricating thin films on a substrate includes a vacuum chamber and a rotatable platen configured to hold one or more substrates within the vacuum chamber. The platen is configured to provide an exposed underside of the one or more substrates when mounted on the platen. The device includes a housing disposed within the vacuum chamber, the housing having a heating element disposed therein, the housing including an upper portion configured to enclose an upper surface of the platen and a lower portion configured to partially enclose an underside surface of the platen, the partially enclosed portion forming a reaction zone. The device also includes a heated evaporation cell operatively coupled to the lower portion of the housing and configured to deliver a pressurized metallic reactant containing negligible amounts of oxygen to the reaction zone. The device includes a deposition zone disposed in the vacuum chamber and isolated from the reaction zone, the deposition zone configured to deposit a deposition species to the exposed underside of the one or more substrates when the substrates are not contained in the reaction zone.

In another embodiment, a method of forming a thin film on a plurality of substrates using multiple self-limiting reactants includes loading the plurality of substrates onto a rotatable platen, the rotatable platen being partially enclosed by a heater configured to have a pressurized reaction zone enclosing a portion of the platen and a depressurized open section configured to provide direct access to the plurality of substrates. The platen is then rotated and a first self-limiting reactant is deposited onto a surface of the substrates in the depressurized open section. A second self-limiting reactant is then heated so as to produce a pressurized gaseous phase inside the pressurized reaction zone, the reaction zone containing negligible amounts of oxygen, the second self-limiting reactant reacting with the first self-limiting reactant to form a thin film on the substrates.

DETAILED DESCRIPTION OF THE PREFERRED EMBODIMENTS

Figure 1:
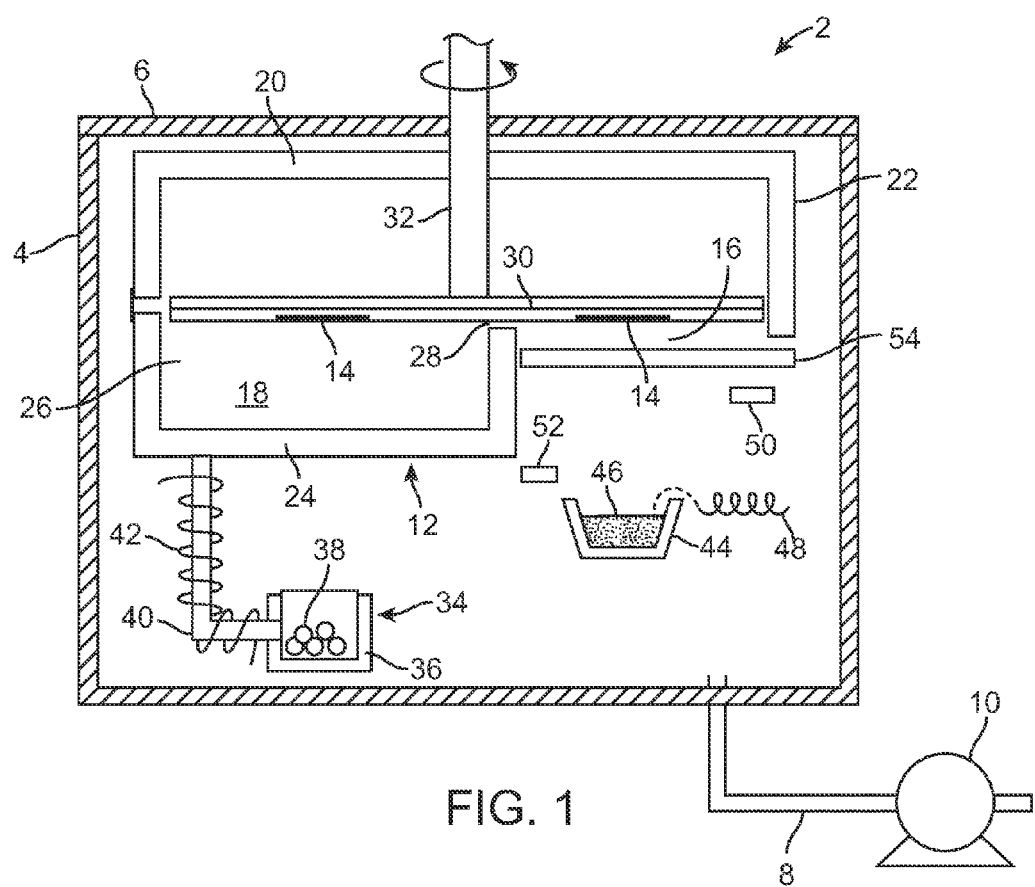
FIG. 1 illustrates a preferred device used to form a film of $MgB_2$ in-situ.

FIG. 1 illustrates a preferred device 2 used to fabricate in-situ MgB$_2$ films. The device 2 includes a vacuum chamber 4 having a removable or openable lid 6 that permits a user to gain access to the interior of the vacuum chamber 4. The vacuum chamber 4 is connected via a vacuum hose 8 to a vacuum pump 10. During operation, the pressure inside the vacuum chamber 4 is a high vacuum—preferably less than $10^{-6}$ Torr.

A pocket heater 12 is provided inside the vacuum chamber 4 and is used to repeatedly move one or more substrates 14 between a deposition zone 16 in which boron is deposited on the one or more substrates 14 and a reaction zone 18 in which pressurized, gaseous magnesium reacts with the deposited boron to form an in-situ MgB$_2$ film. The pocket heater 12 includes a housing 20 which partially encloses the substrates 14 as described in more detail below. The housing 20 preferably includes heating coils (not shown) for heating substrates 14 contained within the interior of the pocket heater 12. Preferably, there is a top heating coil, a side heating coil, and a bottom heating coil although other constructions may be used. The heating coils can heat the pocket heater 12 to a temperature exceeding 800° C., although growth temperatures between 300° C. and 700° C. are preferred.

Figure 2:
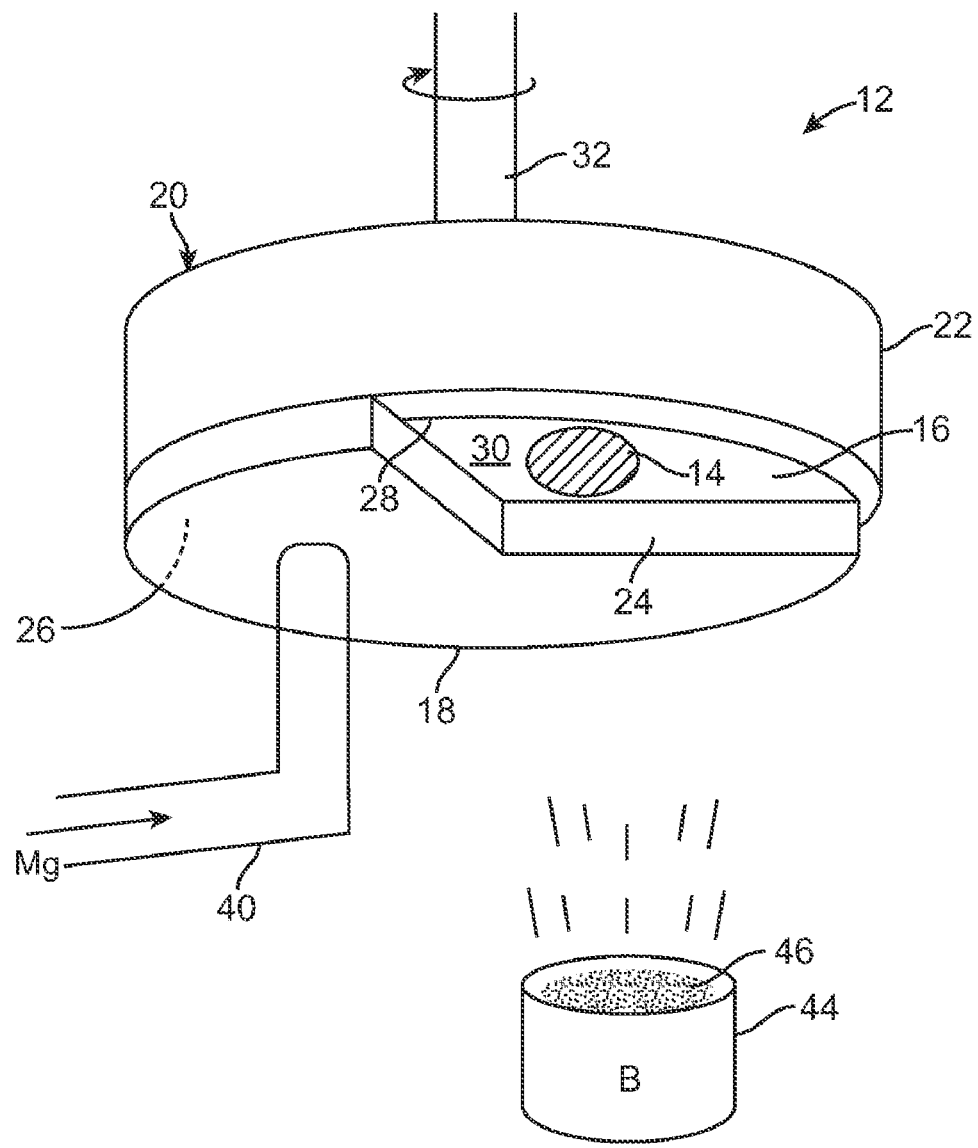
FIG. 2 illustrates a perspective view of the underside of the pocket heater shown in FIG. 1.

The housing 20 of the pocket heater 12 includes an upper portion 22 which completely covers an upper surface of the substrates 14. The housing 20 also includes a lower portion 24 which partially encloses the underside surface of the substrates 14. As best seen in FIG. 2, a pie-shaped wedge is removed from the lower portion 24 of the housing 20 to form the deposition zone 16. The lower portion 24 of the housing 20 that does enclose the substrates 14 forms a reaction chamber 26 (i.e., reaction zone 18) between the underside of the substrates 14 and the interior surface of the lower portion 24 of the housing 20. The reaction chamber 26 is disposed close enough to the underside of the substrates 14 such that a localized high pressure region of magnesium gas is created in the reaction chamber 26. While this pressure has not been measured, it has been reported by others that at 750° C., the required vapor pressure of magnesium is about 10 mTorr in the thermodynamic growth window. It should be understood that "high pressure" in the context of the reaction chamber 26 is a relative term and the pressure within the reaction chamber 26 is above the pressure in the vacuum chamber 4 but significantly less than atmospheric pressure.

A gap 28 is formed between the underside of the substrates 14 and the lower portion 24 of the housing 20. Preferably, the size of this gap 28 can be adjusted by moving the lower portion 24 of the housing 20 towards or away from the substrates 14. Preferably, the gap 28 formed has a width within the range of about 0.005 inch to about 0.015 inch.

A rotatable platen 30 is disposed inside the housing 20 of the pocket heater 12 and is used to rotatably support one or more substrates 14. FIG. 2 illustrates a substrate 14 being held by the platen 30 in the deposition zone 16. The substrate 14 held by the platen 30 may take any number of shapes and forms, including but not limited to, a wafer, chip, flexible tape, or the like. The present method has been used to deposit MgB$_2$ films onto up to three 2" wafers at once, or a single 4" wafer. In addition, the present method of fabricating in-situ MgB$_2$ films can be used with a wide variety of substrate 14 materials. These include by way of illustration and not limitation: LSAT, LaAlO$_3$, MgO, SrTiO$_3$, r-plane sapphire, c-plane sapphire, m-plane sapphire, yttria-stabilized zirconia (YSZ), silicon carbide, polycrystalline alumina, silicon, and stainless steel. With respect to silicon, a Si$_3$N$_4$ buffer layer is first formed on the silicon substrate. It is believed that the present method can be used to deposit MgB$_2$ films on any substrate in which there is no chemical reaction with magnesium, boron, or MgB$_2$.

Consequently, the present method provides a novel way of forming MgB$_2$ films on a variety of technologically interesting and inexpensive substrates. Coated conductor applications are thus possible. In addition, MgB$_2$ films can be deposited on flexible tapes.

Still referring to FIG. 1, the rotatable platen 30 is mounted on a rotatable shaft 32 that passes through the housing 20 of the pocket heater 12. The rotatable shaft 32 is mechanically connected at one end to a motor or servo (not shown) that drives the shaft 32 and thus rotates the platen 30. Preferably, the platen 30 is removable from the shaft 32 such that loading and unloading of the substrates 14 from the platen 30 can take place outside of the pocket heater 12 and vacuum chamber 4.

A magnesium evaporation cell 34 is provided inside the vacuum chamber 4. The magnesium evaporation cell 34 contains heater coils 36 which are used to heat solid magnesium 38 contained within the evaporation cell 34. The magnesium evaporation cell 34 is heated to a temperature of at least 550° C. and more preferably around 650° C. so as to create magnesium vapor. This temperature can be adjusted to control the pressure of gaseous magnesium within the reaction chamber 26. A magnesium feed tube 40 connects the magnesium evaporation cell 34 to the reaction chamber 26 of the pocket heater 12. The magnesium feed tube 40 is preferably heated by heater coils 42 so that magnesium does not condense on the inside of the feed tube 40. Preferably, about 9 amps of power is supplied to the heater coils 42 so as to maintain the magnesium feed tube 40 at a higher temperature than the magnesium evaporation cell 34. Of course a higher or lower amount of power may be used depending on the particular heating coils 42 used.

As an alternative to the magnesium evaporation cell 34 and feed tube 40, a source of magnesium can simply be placed inside the reaction chamber 26 of the pocket heater 12 wherein it will evaporate to form a high pressure gas inside the magnesium reaction chamber 26.

Still referring to FIG. 1, an electron beam crucible 44 is disposed inside the vacuum chamber 4 and beneath the deposition zone 16. Boron 46 is placed inside the electron beam crucible 44. An electron beam gun 48 is positioned inside the vacuum chamber 4 and is aimed at the electron beam crucible 44 containing the boron 46. The electron beam gun 48 is used to heat the boron 46 to a sufficiently high enough temperature such that the boron 46 starts to evaporate.

While the use of an electron beam gun 48 is preferred, the boron 46 may be deposited by any other method known to those skilled in the art.

Two quartz crystal monitors (QCM) 50, 52 are optionally included in the vacuum chamber 4. A first QCM monitor 50 is preferably aimed downward toward the electron beam crucible 44 and is used to monitor the evaporation rate of boron 46. The second QCM monitor 52 is preferably aimed upward toward the underside of the substrates 14 and is used to monitor leakage of magnesium from the pocket heater 12 through the gap 28.

Still referring to FIG. 1, a moveable shutter 54 is positioned inside the vacuum chamber 4 between the deposition zone 16 of the pocket heater 12 and the magnesium evaporation cell 34. The shutter 54 is used to prevent the boron 46 from depositing on the underside surface of the substrates 14.

FIG. 2 shows a perspective view of the underside of the pocket heater 12. As seen in FIG. 2, the deposition zone 16 is in the shape of a pie-shaped wedge. During operation, the shaft 32 rotates the platen 30 containing one or more substrates 14. The substrates 14 repeatedly move between the deposition zone 16 in which boron 46 is deposited and a reaction zone 18 in which pressurized, gaseous magnesium reacts to form $MgB_2$.

Figure 3:
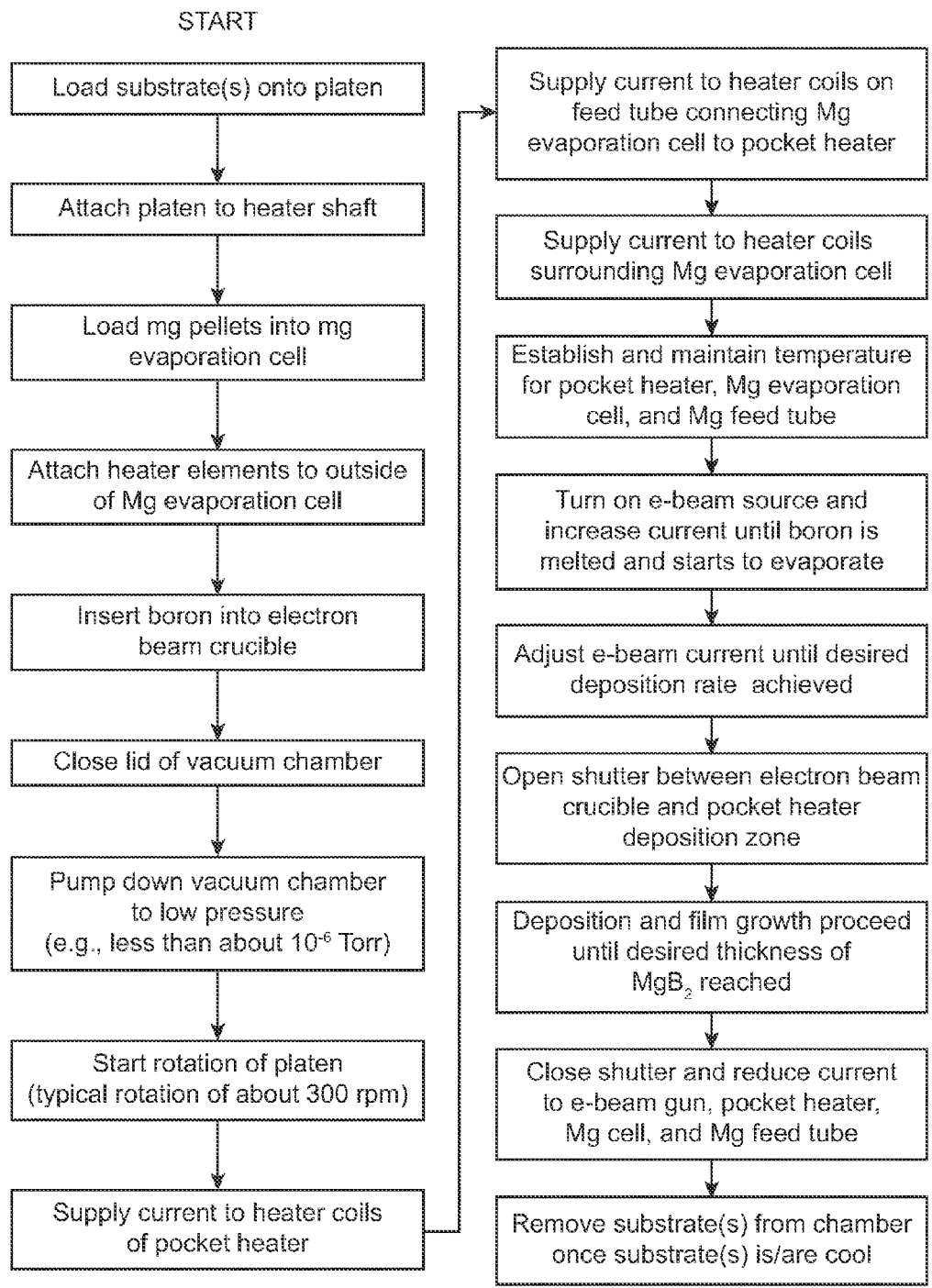
FIG. 3 is a flow chart of a preferred process of making a film of $MgB_2$ in-situ.

FIG. 3 is a flow chart illustrating one preferred method of forming $MgB_2$ on a substrate 14. With reference to FIG. 3, one or more substrates 14 are loaded onto the platen 30. The platen 30 is then attached to the shaft 32 of the pocket heater 12. A source of magnesium 38 (preferably in the form of magnesium pellets) is loaded into the magnesium evaporation cell 34. Boron 46 is then loaded into the electron beam crucible 44. The lid 6 of the vacuum chamber 4 is then closed and the vacuum chamber 4 is pumped down to a low pressure (preferably less than about $10^{-6}$ Torr).

Rotation of the platen 30 is then initiated by turning the shaft 32. The platen 30 is rotated at a rate within the range of about 100 rpm to about 500 rpm. Preferably, the rotation rate is about 300 rpm. Current is then supplied to heater coils (not shown) of the pocket heater 12 to heat the substrates 14 contained therein. Current is also supplied to the heater coils 42 on the magnesium feed tube 40 that connects the magnesium evaporation cell 34 and the reaction chamber 26 of the pocket heater 12. Current is then supplied to the heater coils 36 surrounding the magnesium evaporation cell 34. The typical temperature of the magnesium evaporation cell 34 needed for deposition is around 650° C.

Once the temperature of the pocket heater 12, magnesium evaporation cell 34, and magnesium feed tube 40 have been established and maintained, the electron beam gun 48 is turned on and the supplied current is increased until the boron 46 melts and begins to evaporate. The current supplied to the electron beam gun 48 is adjusted until the desired deposition rate is achieved. A typical preferred deposition rate is about 0.1 nm/sec. This can be determined by use of QCM monitor 50.

The shutter 54 disposed between the electron beam crucible 44 and the deposition zone 16 is then opened. Deposition of boron 46 and film growth of $MgB_2$ on the underside of the substrates 14 proceed until the desired thickness of $MgB_2$ is reached. Once the desired thickness of $MgB_2$ is reached, the shutter 54 is closed and the current to the electron beam gun 48, pocket heater 12, magnesium evaporation cell 34, and magnesium feed tube 40 is reduced to zero (the current to the magnesium feed tube 40 is left on for a little while in order to avoid condensation of magnesium and plugging of the feed tube 40). The substrates 14 are then removed from the platen 30 once the substrates have had time to cool down (typically a few hours).

Figure 4:
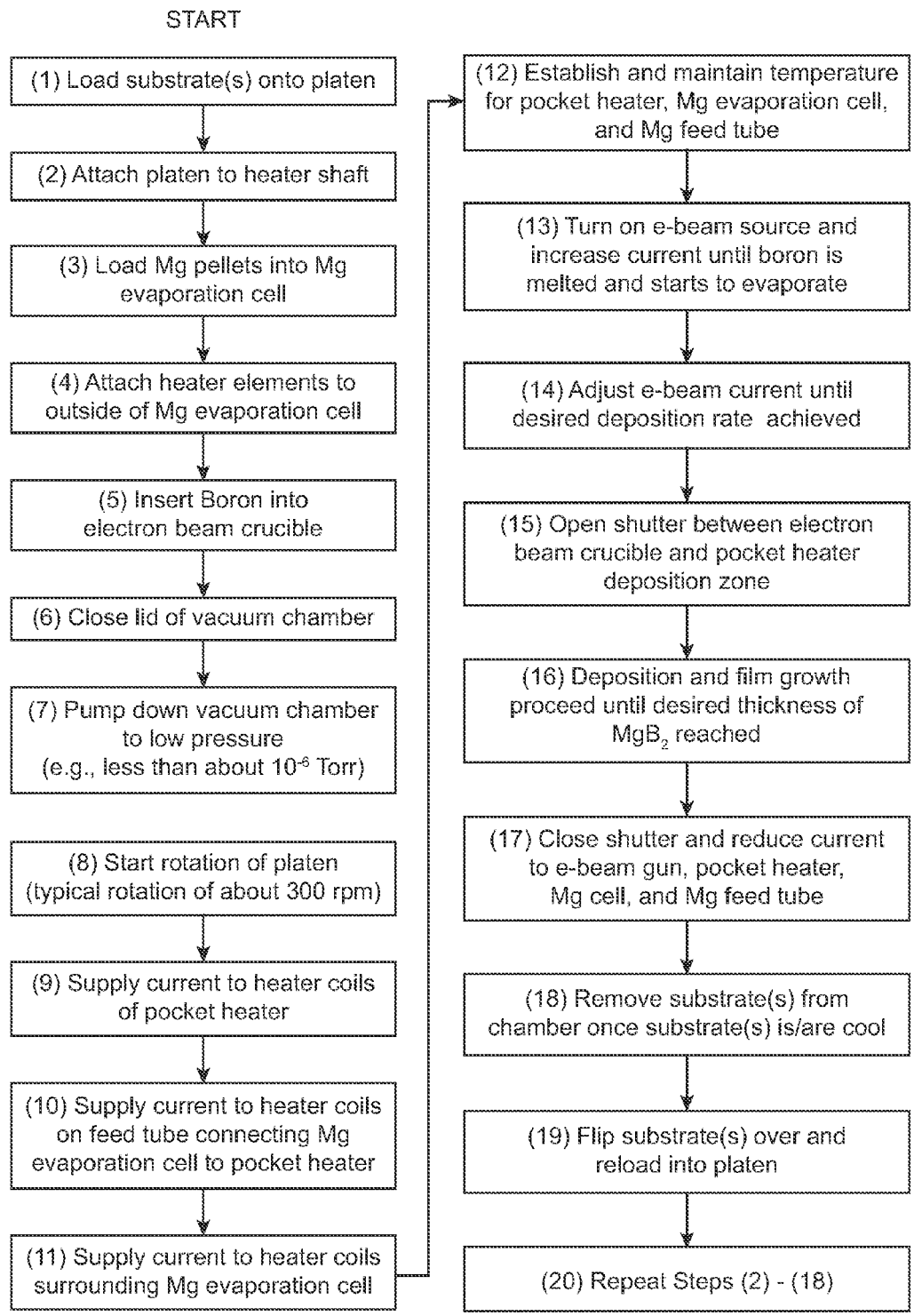
FIG. 4 is a flow chart of another preferred process of making a film of $MgB_2$ in-situ.

In one preferred embodiment of the invention, after the substrates 14 have had time to cool down, the substrates 14 are turned over to expose the top side of the substrates 14 to the deposition zone 16 and reaction zone 18. The process described above is then repeated to deposit a $MgB_2$ on the second side (formerly the top side) of the substrates 14. FIG. 4 illustrates the process of depositing $MgB_2$ on both sides of a substrate 14. In this manner, double-sided deposition of $MgB_2$ can be performed which is required for some applications (e.g., microwave filters and microstrip transmission lines).

The method described herein is particularly advantageous because it is compatible with multilayer deposition of other materials which is essential for various electronics applications. In addition, there is no need to maintain control of the magnesium/boron flux ratio because the magnesium vapor is produced independently of the boron deposition process. The pocket heater 12 used in the process is also beneficial in that $MgB_2$ films can be grown on multiple, varied substrates 14 simultaneously.

The above-described method also effectively avoids MgO contamination because there are negligible amounts of oxygen and MgO in the reaction chamber 26 where $MgB_2$ is formed. In addition, any magnesium vapor that escapes the reaction chamber 26 should condense, getter, and will not be incorporated into the grown film.

Figure 5:
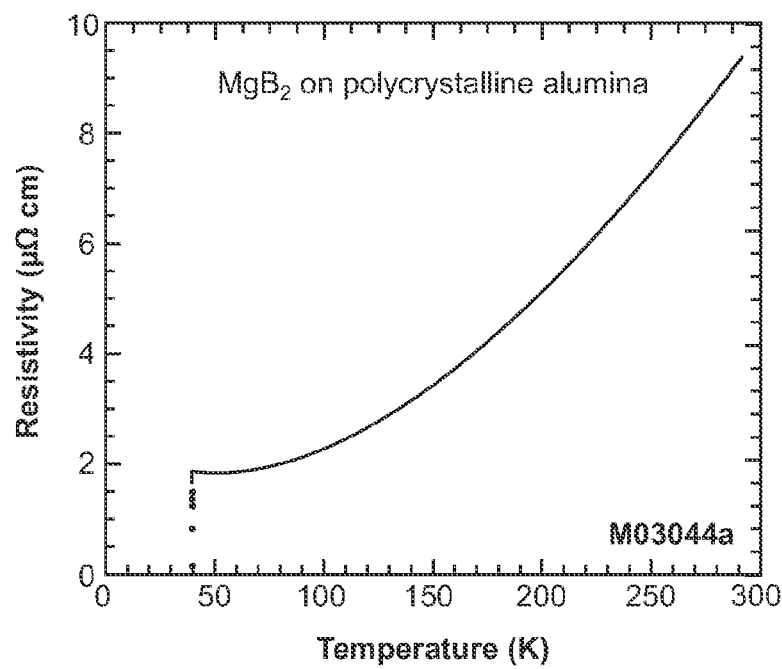
FIG. 5 illustrates the resistivity of a $MgB_2$ film deposited on a polycrystalline alumina substrate.
Figure 6:
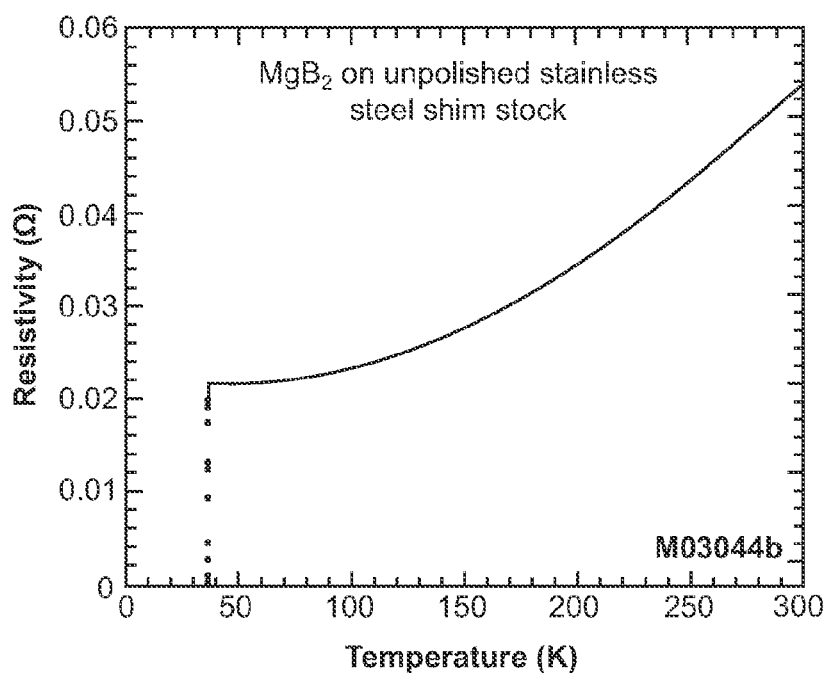
FIG. 6 illustrates the resistance of a $MgB_2$ film deposited on flexible stainless steel tape.

FIG. 5 illustrates the resistivity of a $MgB_2$ film deposited on a polycrystalline alumina substrate. FIG. 6 illustrates the resistance of a $MgB_2$ film deposited on flexible stainless steel tape. For both substrates 14, a $T_c$ of approximately 38-39° C. is achieved.

Figure 7:
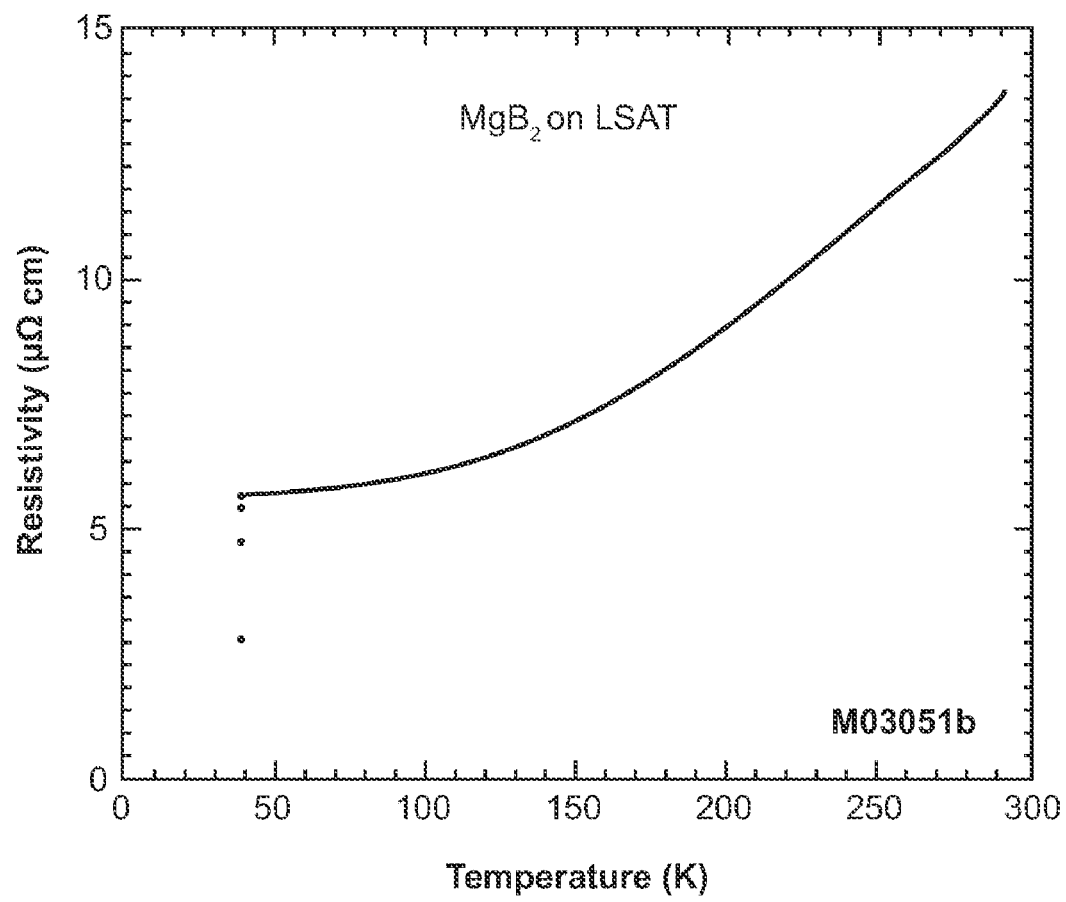
FIG. 7 illustrates the resistivity of a $MgB_2$ film deposited on LSAT.
Figure 8:
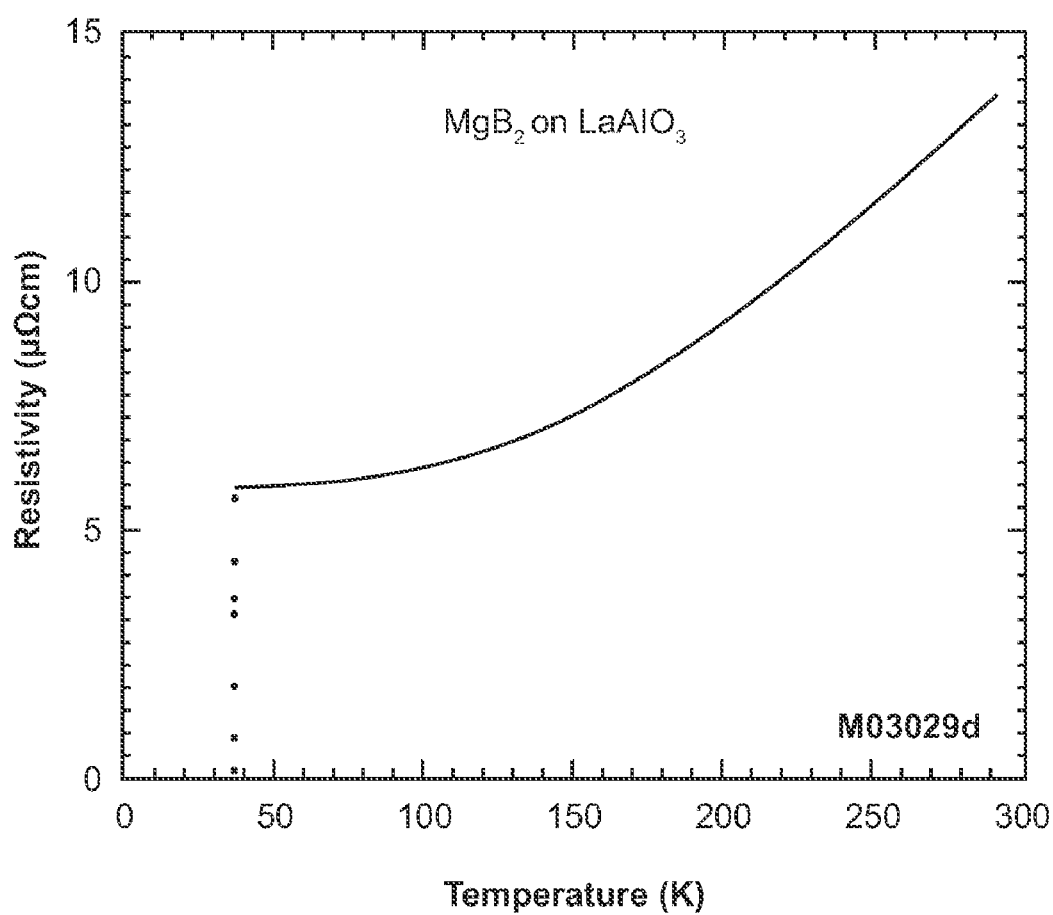
FIG. 8 illustrates the resistivity of a $MgB_2$ film deposited on $LaAlO_3$.
Figure 9:
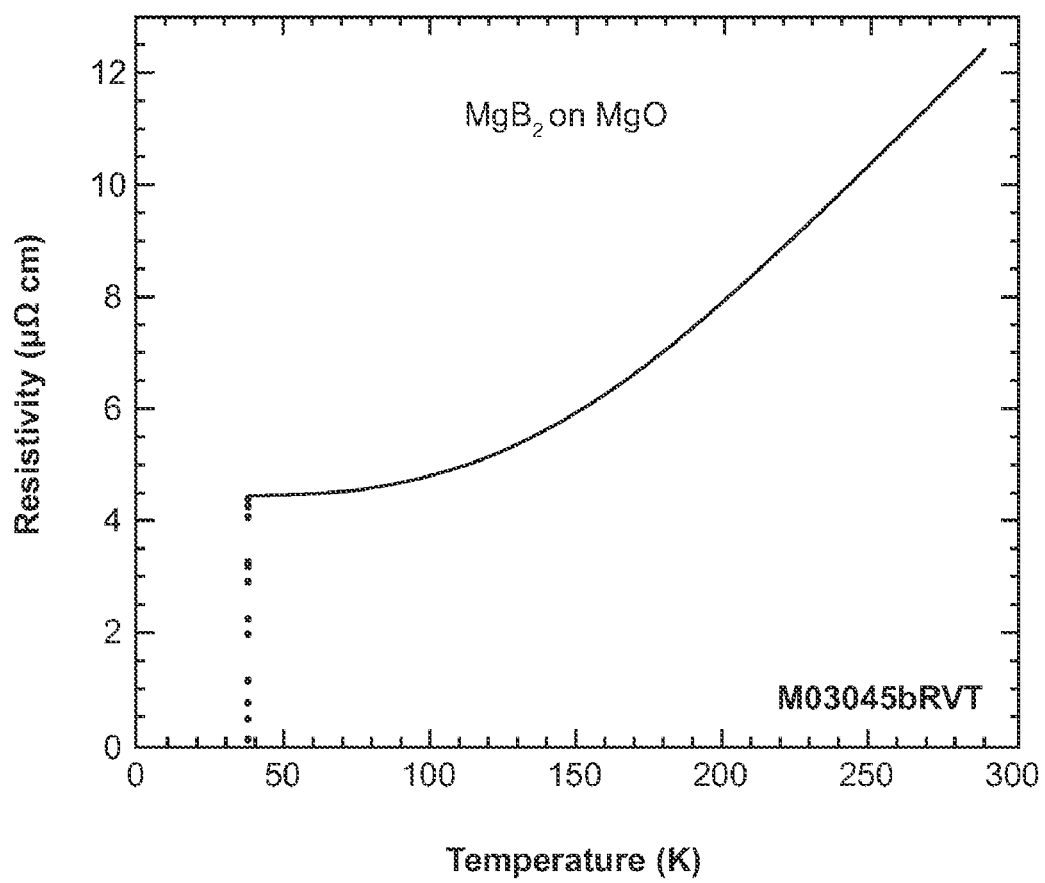
FIG. 9 illustrates the resistivity of a MgB$_2$ film deposited on MgO.
Figure 10:
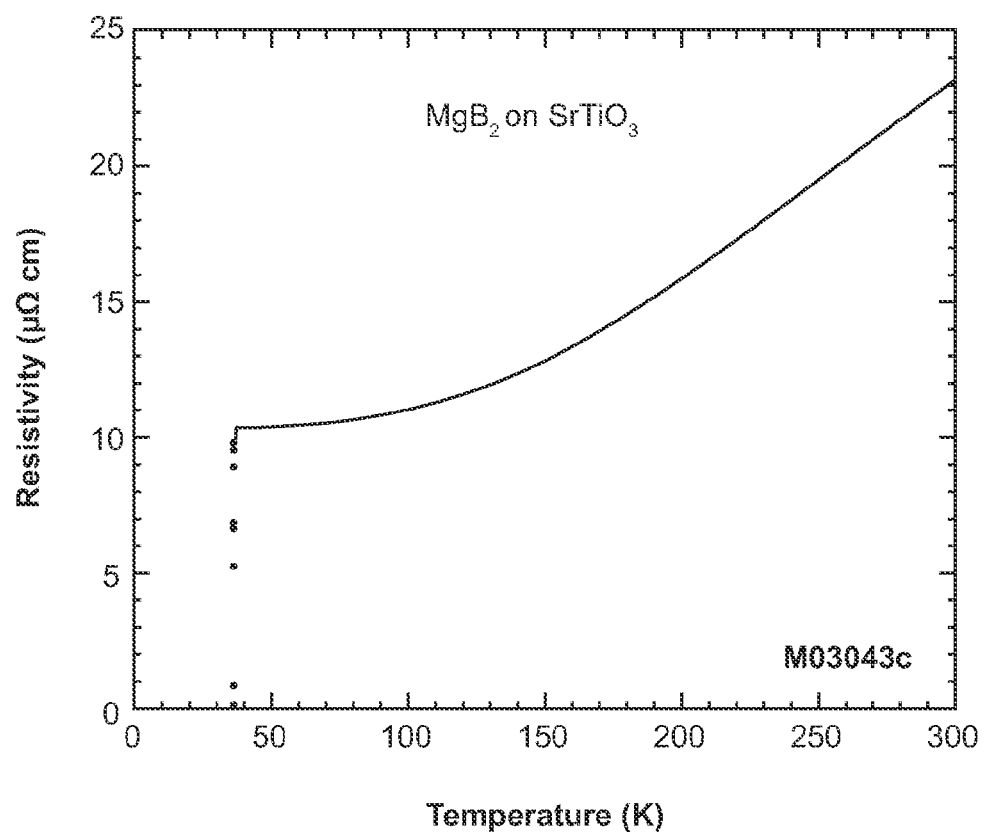
FIG. 10 illustrates the resistivity of a MgB$_2$ film deposited on SrTiO$_3$.
Figure 11:
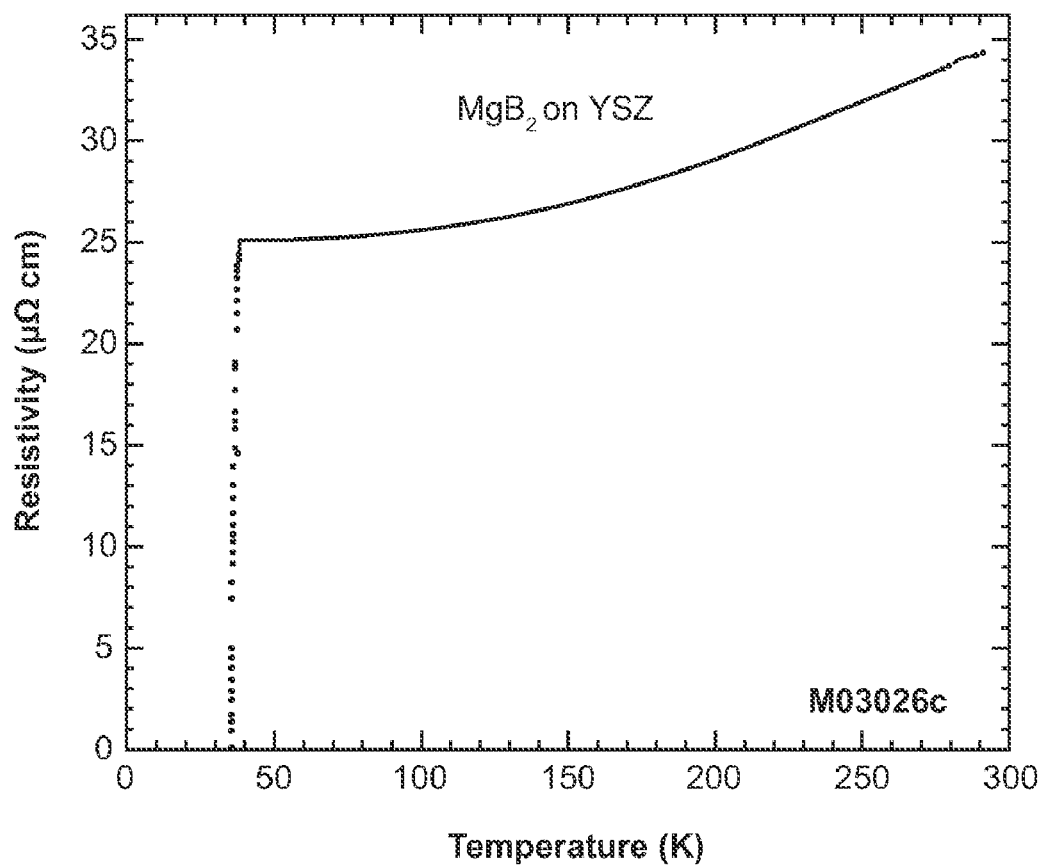
FIG. 11 illustrates the resistivity of a MgB$_2$ film deposited on YSZ.
Figure 12:
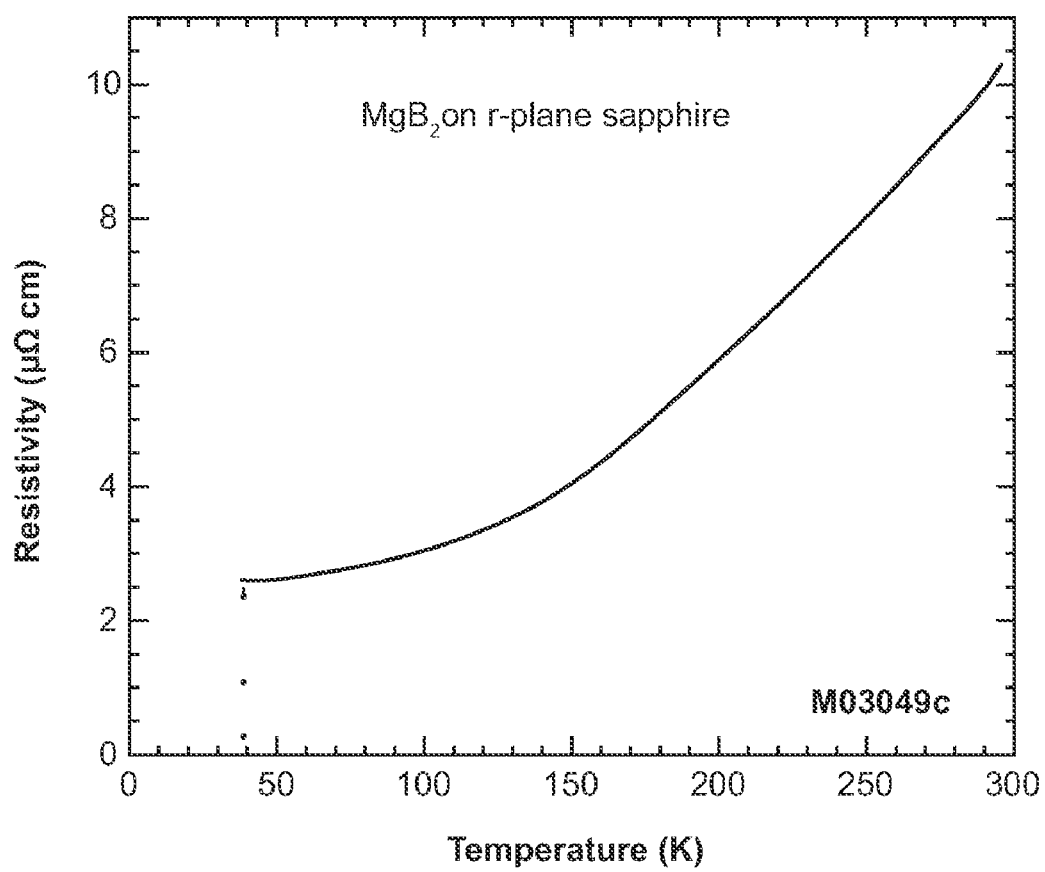
FIG. 12 illustrates the resistivity of a MgB$_2$ film deposited on r-plane sapphire.
Figure 13:
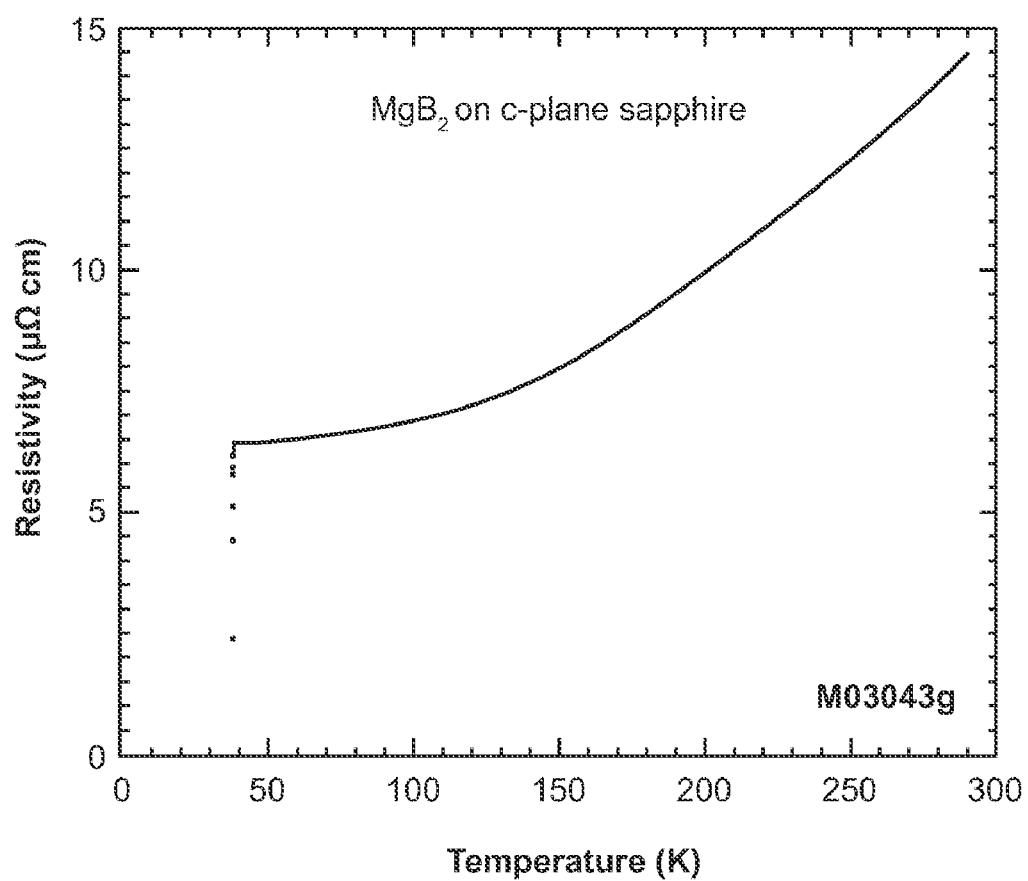
FIG. 13 illustrates the resistivity of a MgB$_2$ film deposited on c-plane sapphire.
Figure 14:
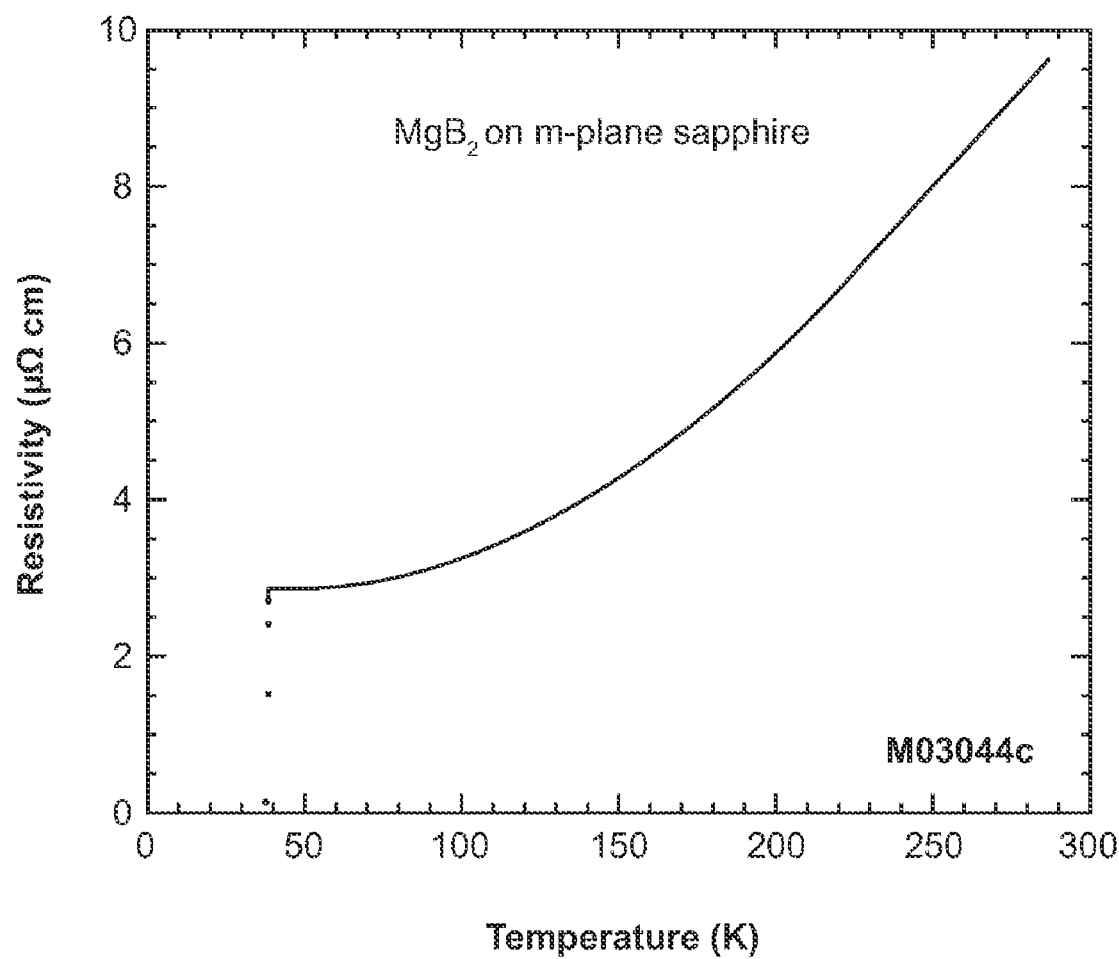
FIG. 14 illustrates the resistivity of a MgB$_2$ film deposited on m-plane sapphire.
Figure 15:
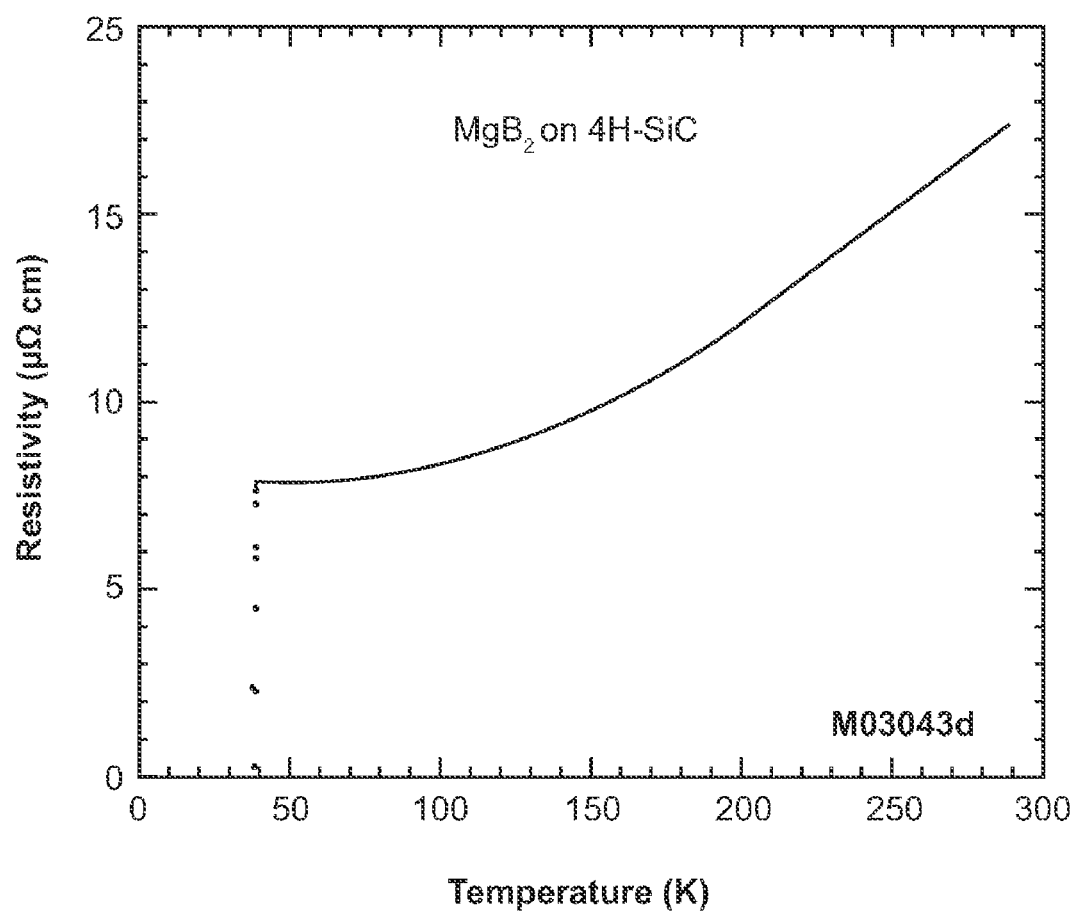
FIG. 15 illustrates the resistivity of a MgB$_2$ film deposited on 4H—SiC.
Figure 16:
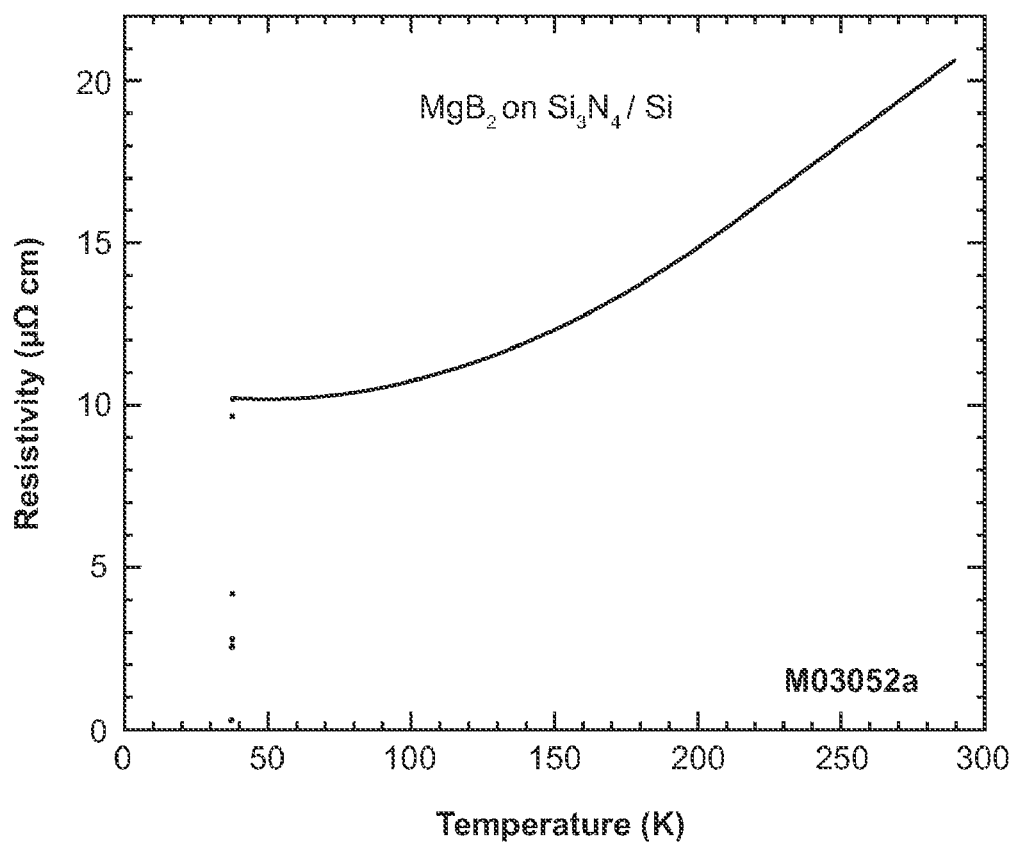
FIG. 16 illustrates the resistivity of a MgB$_2$ film deposited on Si$_3$N$_4$/Si.

FIG. 7 illustrates the resistivity of a $MgB_2$ film deposited on LSAT. FIG. 8 illustrates the resistivity of a $MgB_2$ film deposited on $LaAlO_3$. FIG. 9 illustrates the resistivity of a $MgB_2$ film deposited on MgO. FIG. 10 illustrates the resistivity of a $MgB_2$ film deposited on $SrTiO_3$. FIG. 11 illustrates the resistivity of a $MgB_2$ film deposited on YSZ. FIG. 12 illustrates the resistivity of a $MgB_2$ film deposited on r-plane sapphire. FIG. 13 illustrates the resistivity of a $MgB_2$ film deposited on c-plane sapphire. FIG. 14 illustrates the resistivity of a $MgB_2$ film deposited on m-plane sapphire. FIG. 15 illustrates the resistivity of a $MgB_2$ film deposited on 4H—SiC. FIG. 16 illustrates the resistivity of a $MgB_2$ film deposited on $Si_3N_4$/Si. In this case, a $Si_3N_4$ buffer layer is first formed on silicon using conventional processes known to those skilled in the art. The $Si_3N_4$ buffer layer may be formed on the substrate 14 prior to it being loaded into the device 2. Alternatively, the pocket heater 12 may include a nitrogen feed in which the $Si_3N_4$ buffer layer is formed inside the pocket heater 12.

Figure 17:
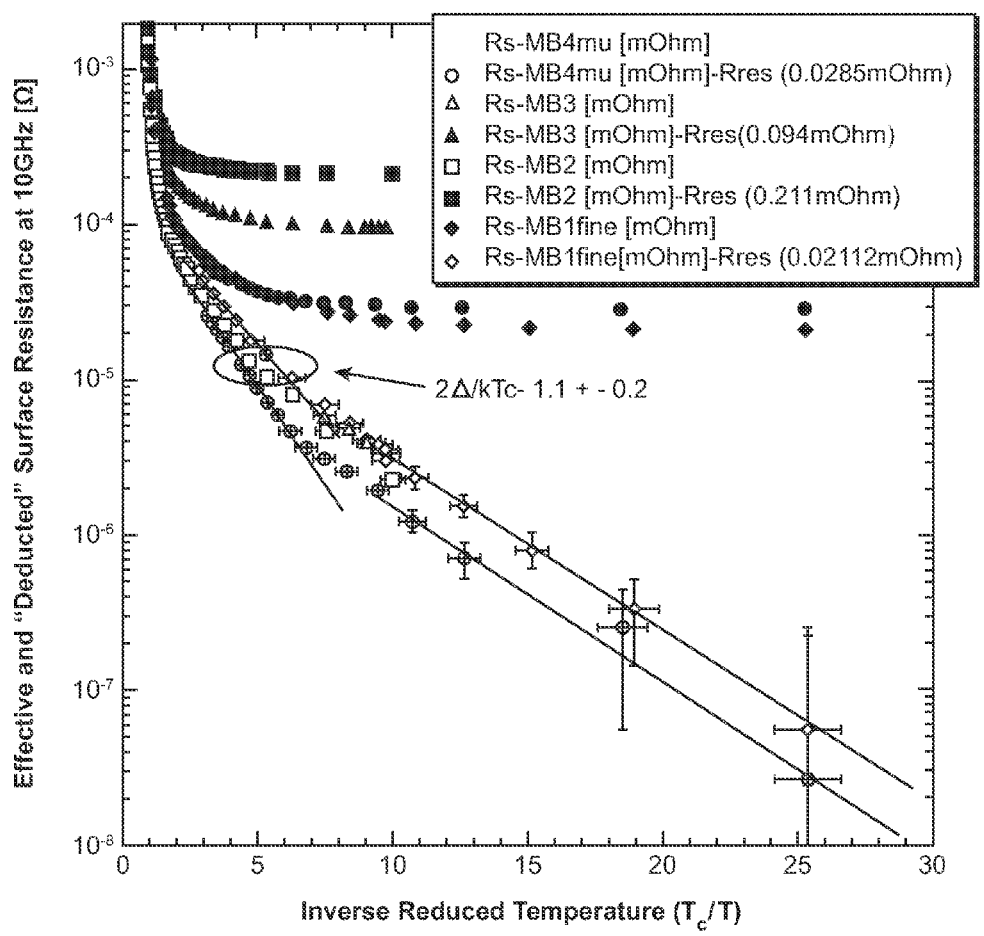
FIG. 17 is a plot of estimated surface resistance values of MgB$_2$ film deposited on sapphire and alumina substrates.

FIG. 17 is graph of the estimated surface resistance at 10 GHz vs. the inverse reduced temperature ($T_c/T$) of $MgB_2$ films deposited on sapphire and alumina substrates. The surface resistance values are estimated because extrinsic losses ($R_{res}$ in FIG. 17) in the measurements had to be estimated and subtracted off in order to arrive at the intrinsic surface resistance $R_s$ of the $MgB_2$ film. Samples M1 and M4 of FIG. 17 are $MgB_2$ films deposited onto a sapphire substrate. Samples M2 and M3 are $MgB_2$ films deposited onto an alumina substrate.

In the particular preferred embodiment of the invention, magnesium is heated in an evaporation cell 34 to provide gaseous magnesium to the reaction chamber 26. It should be understood, however, that other elements that are non-gaseous at standard room temperature and pressure may also be used with the present method. In this regard, the particular element (in its non-gaseous state) would be placed into an evaporation cell 34 and heated such that a gaseous form of the element is produced and delivered to the reaction chamber 26.

For example, TBCCO ($Tl_2Ba_2CaCu_2O_8$ or other phases) may be produced in accordance with the invention. One or more of the non-gaseous elements (i.e., Tl, Ba, Ca, or Cu) may be placed into an evaporation cell 34 which is then connected to the reaction chamber 26 as described above. A separate reaction chamber 26 connected to a source of oxygen is also provided for the oxidation reaction. For example, U.S. Pat. No. 6,527,866 illustrates a pocket heater device having a reaction chamber 26 coupled to an oxygen source.

With respect to TBCCO, one particular method employs placing Tl into the evaporation cell 34 and heating the evaporation cell 34 to form Tl vapor which then passes to a reaction chamber 26. Another separate reaction chamber 26 containing oxygen is used to oxidize the film. The remaining metals (Ba, Ca, or Cu) are deposited onto the substrate 14 in the deposition zone 16.

Still other superconducting thin films may be formed in accordance with the method described above. These include, for example, bismuth strontium calcium copper oxide (BSCCO), mercury barium calcium copper oxide (HBCCO), and yttrium barium copper oxide (YBCO). Generally, the method described above can be used with any element that has a relatively high vapor pressure at the operating temperature of the pocket heater 12. In addition, the reaction of the gaseous element inside the reaction zone 18 must be self-limiting. That is, using $MgB_2$ as an example, when magnesium reacts with boron, the reaction does not produce $Mg_2B$ or $Mg_3B_2$.

It should also be understood that the present invention may be used to manufacture non-superconducting films. Again, the method described above can be used with any element that has a relatively high vapor pressure at the operating temperature of the pocket heater 12. In addition, the reaction of the gaseous element inside the reaction zone 18 must be self-limiting. Examples of non-superconducting films include, by way of illustration and not limitation, dielectrics, ferroelectrics, semiconductors such as GaAs, InP, and GaN, magnetic materials, piezoelectric materials, and the like.

Figure 18:
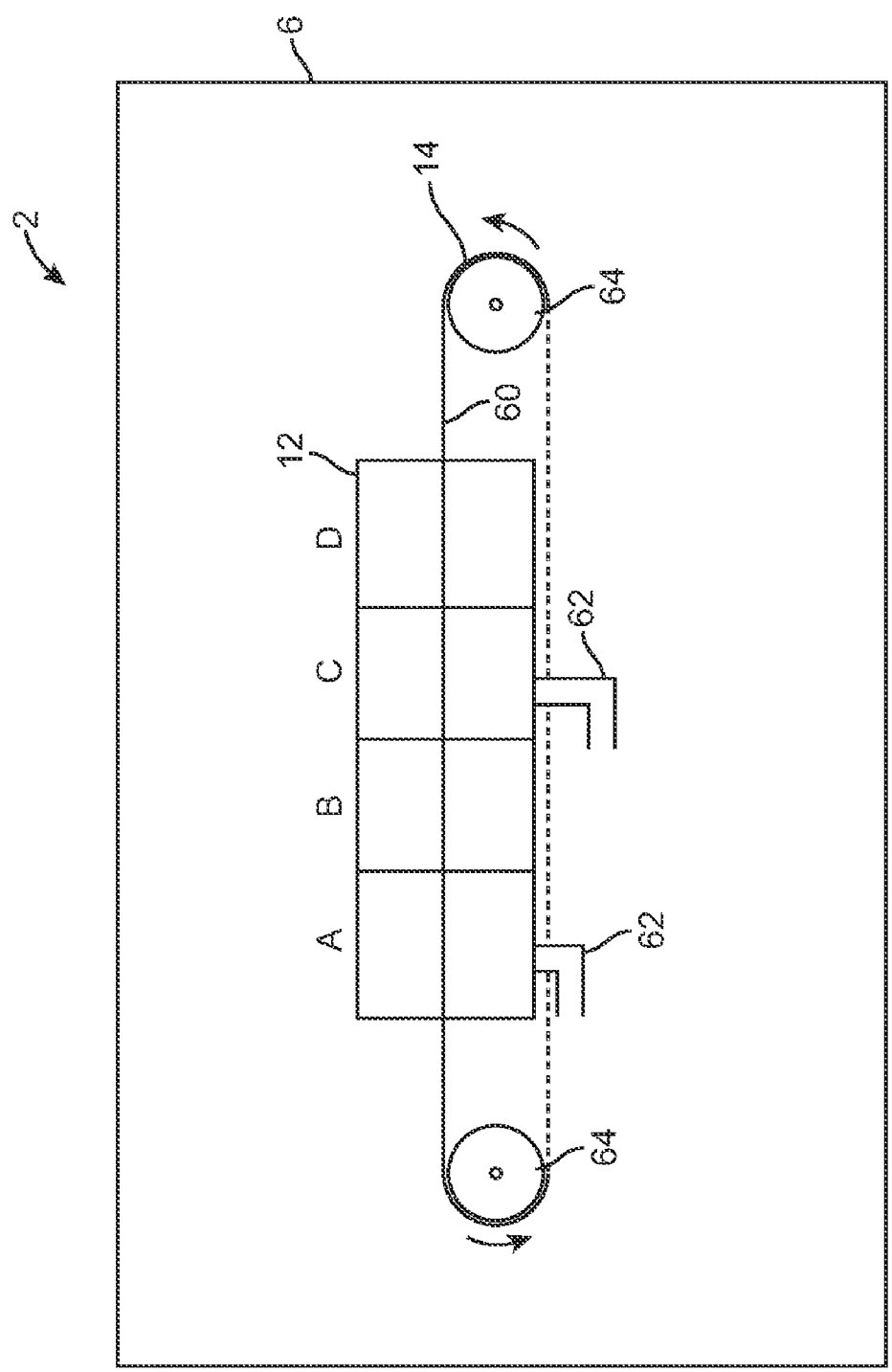
FIG. 18 illustrates a device according to one preferred aspect of the invention for depositing thin films on a long ribbon of tape.

FIG. 18 illustrates one alternative embodiment of the device 2 used to form a thin film on a ribbon of tape 60. In this embodiment, the pocket heater 12 does not use a rotatable platen 30 as in the pocket heater 12 shown, for example, in FIG. 1. Instead, a conveyor arrangement is used to pass the substrate 14 (in this case a long ribbon of tape 60) through the pocket heater 12. In FIG. 18, the pocket heater 12 has four different zones (A, B, C, and D) in which the film forming process takes place. As an example, zones B and D might take the form of deposition zones. In contrast, zones A and C might take the form of reaction zones in which a gaseous reactants are input via feeds 62. Of course, the particular arrangement shown in FIG. 18 is merely exemplary and other configurations can be used depending on the type of film produced.

FIG. 18 illustrates the substrate 14 being unrolled and rolled on two rotatable drums 64. In some applications, however, the nature of the thin film and/or substrate 14 may prevent the ribbon of tape 60 from being stored on drums 64. In this case the ribbon of tape 60 is fed and stored in a linear format. In addition, while FIG. 18 shows the ribbon of tape 60 making a single pass through the pocket heater 12, the tape 60 may make several passes through the pocket heater 12. In this regard, the ribbon of tape 60 may take the form of a single continuous ribbon of tape 60 that wraps around the rotatable drums 64. The continuous ribbon of tape 60 is shown in dashed lines in FIG. 18.

In the case of $MgB_2$, the deposition of boron onto the tape substrate 14 may occur prior to the tape substrate 14 entering the magnesium pocket (e.g., zones A or C in FIG. 18).

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

What is claimed is:

1. A device for fabricating thin films on a substrate comprising:
    a vacuum chamber;
    a rotatable platen configured to hold one or more substrates within the vacuum chamber, the platen configured to provide an exposed underside of the one or more substrates when mounted on the platen;
    a housing disposed within the vacuum chamber, the housing having a heating element disposed therein, the housing including an upper portion configured to enclose an upper surface of the platen and a lower portion configured to partially enclose an underside surface of the platen, the partially enclosed portion forming a reaction zone;
    a heated evaporation cell containing heater coils therein, the heated evaporation cell operatively coupled to the lower portion of the housing via a feed tube comprising separate heater coils and configured to deliver a pressurized metallic reactant containing negligible amounts of oxygen to the reaction zone; and
    a deposition zone disposed in the vacuum chamber and isolated from the reaction zone, the deposition zone configured to deposit a deposition species to the exposed underside of the one or more substrates when said substrates are not contained in the reaction zone.

2. The device of claim 1, wherein the metallic reactant comprises magnesium.

3. The device of claim 2, wherein the deposition species comprises boron.

4. The device of claim 1, wherein the deposition zone comprises an electron beam crucible.

5. The device of claim 1, wherein the pressure of the reaction zone is greater than the pressure in the vacuum chamber but significantly less than atmospheric pressure.

6. The device of claim 5, wherein the pressure is above 10 mTorr.

7. The device of claim 1, wherein the heater coils of the evaporation cell are coupled to a current source.

8. The device of claim 1, wherein the lower portion of the housing is configured to enclose a majority of the underside surface of the platen.

9. The device of claim 1, wherein the substrate is selected from the group consisting of LSAT, $LaAlO_3$, MgO, $SrTiO_3$, r-plane sapphire, yttria-stabilized zirconia, silicon carbide, polycrystalline alumina, silicon, and stainless steel.

10. The device of claim 1, wherein the reaction of the metallic reactant with the deposition species is a self-limiting reaction.

11. The device of claim 1, wherein the thin film comprises a dielectric material.

12. The device of claim 1, wherein the thin film comprises a ferroelectric material.

13. The device of claim 1, wherein the thin film comprises a semiconductor material.

14. The device of claim 1, wherein the thin film comprises a piezoelectric material.

15. The device of claim 1, wherein the thin film comprises a superconducting material.

16. A device for fabricating thin films on a substrate comprising:
- a vacuum chamber;
- a rotatable platen configured to hold one or more substrates within the vacuum chamber, the platen configured to provide an exposed underside of the one or more substrates when mounted on the platen;
- a housing disposed within the vacuum chamber, the housing having a heating element disposed therein, the housing including an upper portion configured to enclose an upper surface of the platen and a lower portion configured to partially enclose an underside surface of the platen, the partially enclosed portion forming a reaction zone;
- a heated evaporation cell containing heater coils therein, the heated evaporation cell operatively coupled to the lower portion of the housing via a feed tube comprising separate heater coils and configured to deliver a pressurized reactant to the reaction zone; and
- a source of current coupled to the evaporation cell heater coils and the feed tube heater coils; and
- a deposition zone disposed in the vacuum chamber and isolated from the reaction zone, the deposition zone configured to deposit a deposition species to the exposed underside of the one or more substrates when said substrates are not contained in the reaction zone.

17. The device of claim 16, wherein the reaction of the reactant with the deposition species is a self-limiting reaction.

18. The device of claim 16, wherein the thin film comprises a dielectric material.

19. The device of claim 16, wherein the thin film comprises a ferroelectric material.

20. The device of claim 16, wherein the thin film comprises a semiconductor material.

21. The device of claim 16, wherein the thin film comprises a piezoelectric material.

22. The device of claim 16, wherein the thin film comprises a superconducting material.

23. The device of claim 16, wherein the source of current is configured to heat the evaporation cell and the feed tube wherein the temperature of the feed tube is at least as high as the temperature of the evaporation cell.

* * * * *